United States Patent [19]

Griffin

[11] Patent Number: 4,494,092
[45] Date of Patent: Jan. 15, 1985

[54] FILTER PIN ELECTRICAL CONNECTOR

[75] Inventor: Alan L. Griffin, Redlands, Calif.

[73] Assignee: The Deutsch Company Electronic Components Division, Banning, Calif.

[21] Appl. No.: 397,603

[22] Filed: Jul. 12, 1982

[51] Int. Cl.³ .................... H03H 7/01; H01R 13/66; H01R 23/22
[52] U.S. Cl. .................. 333/182; 333/183; 339/147 R; 29/25.42
[58] Field of Search ............. 333/167, 182–185; 339/147 R, 147 C, 143 R; 361/307, 313, 321; 29/25.42

[56] References Cited

U.S. PATENT DOCUMENTS

| | | | |
|---|---|---|---|
| 3,538,464 | 11/1970 | Walsh | 333/182 |
| 3,546,638 | 12/1970 | Park | 333/182 |
| 4,079,343 | 3/1978 | Nijman | 333/185 X |
| 4,083,022 | 4/1978 | Nijman | 339/147 R X |
| 4,144,509 | 3/1979 | Boutros | 339/147 R X |

Primary Examiner—Marvin L. Nussbaum
Attorney, Agent, or Firm—Gausewitz, Carr, Rothenberg & Edwards

[57] ABSTRACT

This invention provides a filter pin connector having two capacitor disc assemblies, each with a plurality of openings receiving the connector pins and held within a connector shell. Each capacitor disc includes a plurality of laminations of conductive material formed by providing conductive ink on layers of ceramic tape which are fused together to form a unit. The laminations are in two sets and alternately arranged to provide opposed capacitor plates. The laminations of one set are connected to the pins and those of the other are connected to the shell.

20 Claims, 14 Drawing Figures

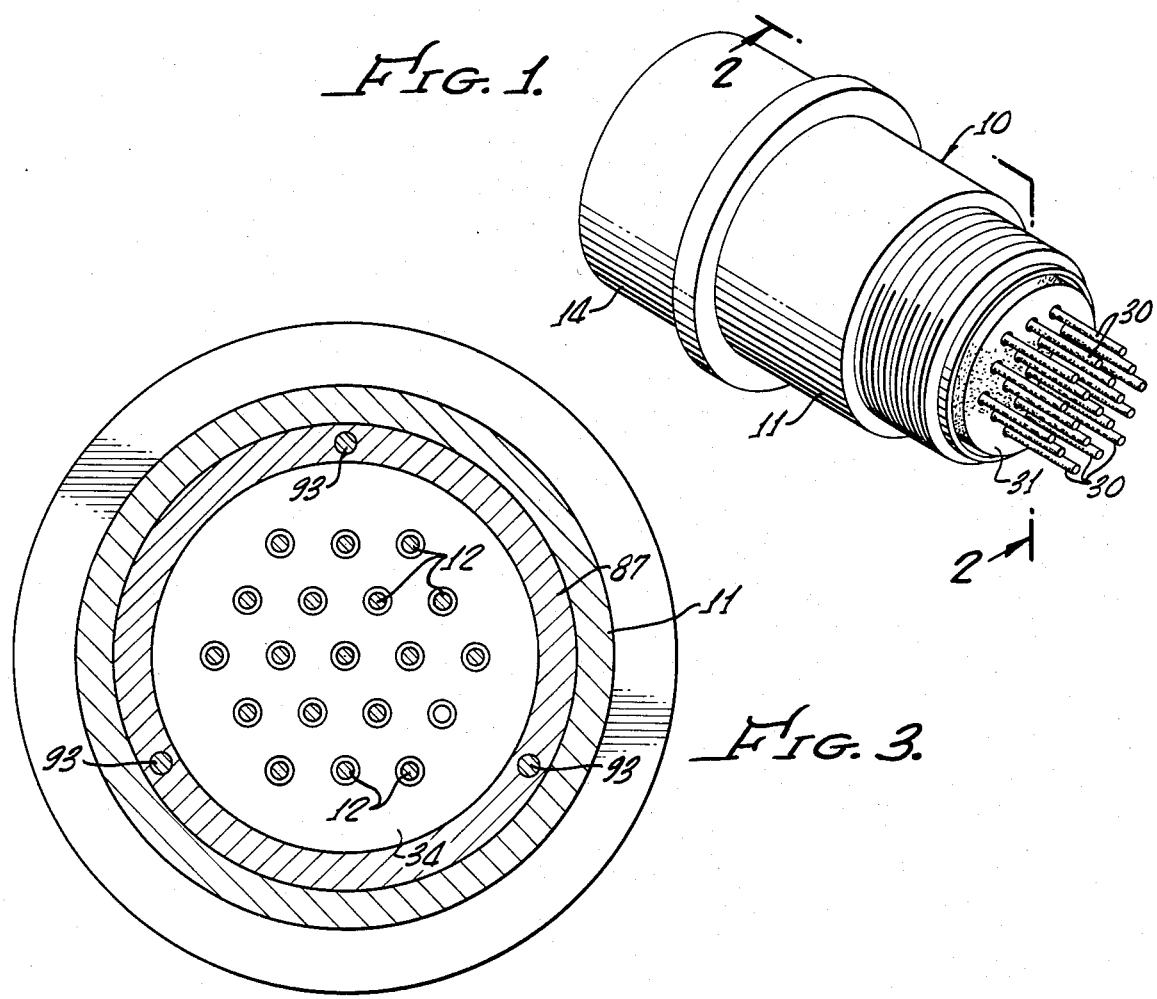
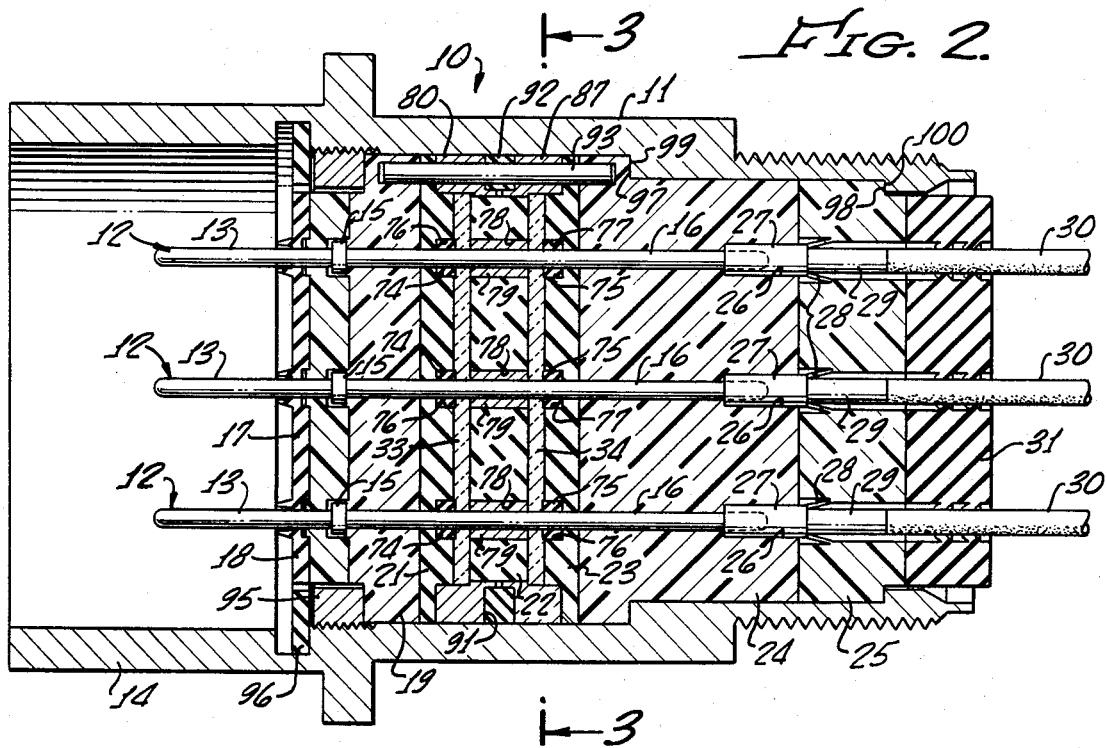

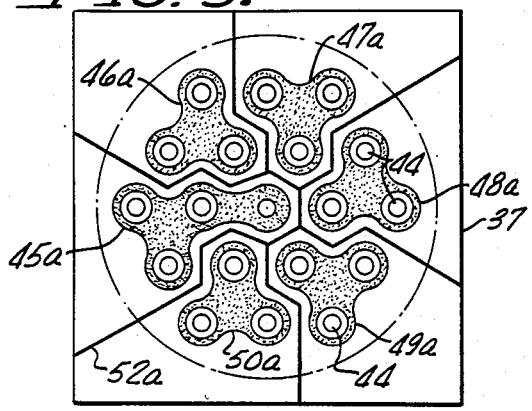
FIG. 5.
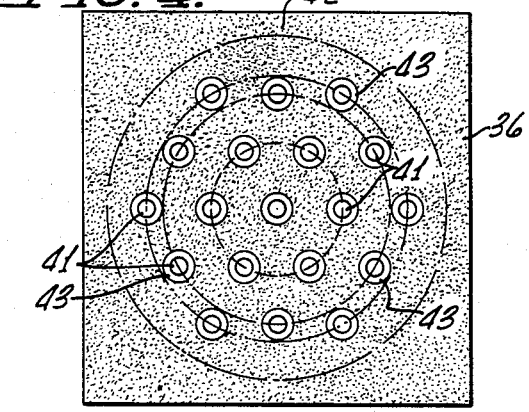
FIG. 4.
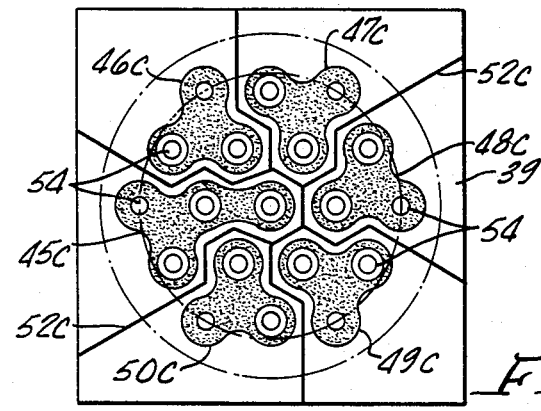
FIG. 6
FIG. 7.
FIG. 8.
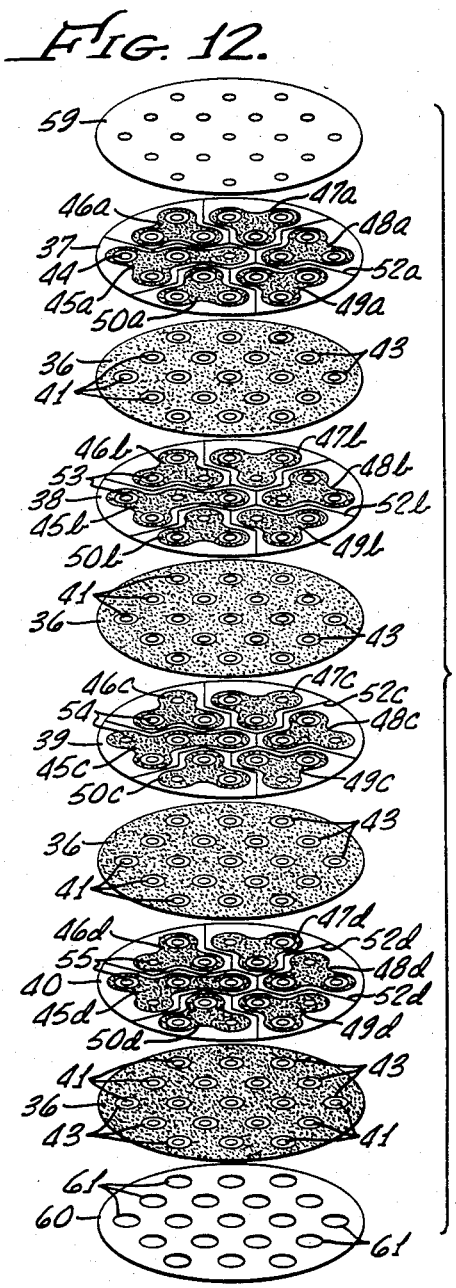
FIG. 12.

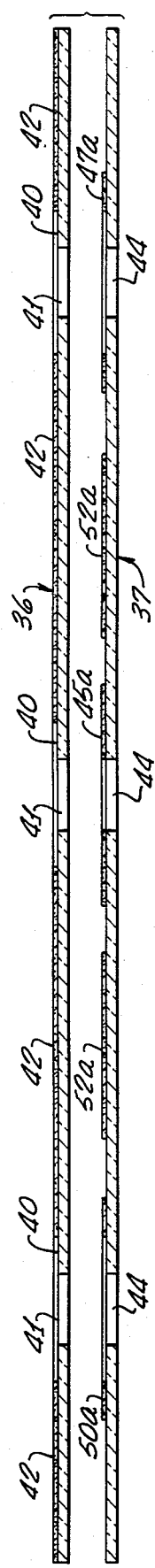
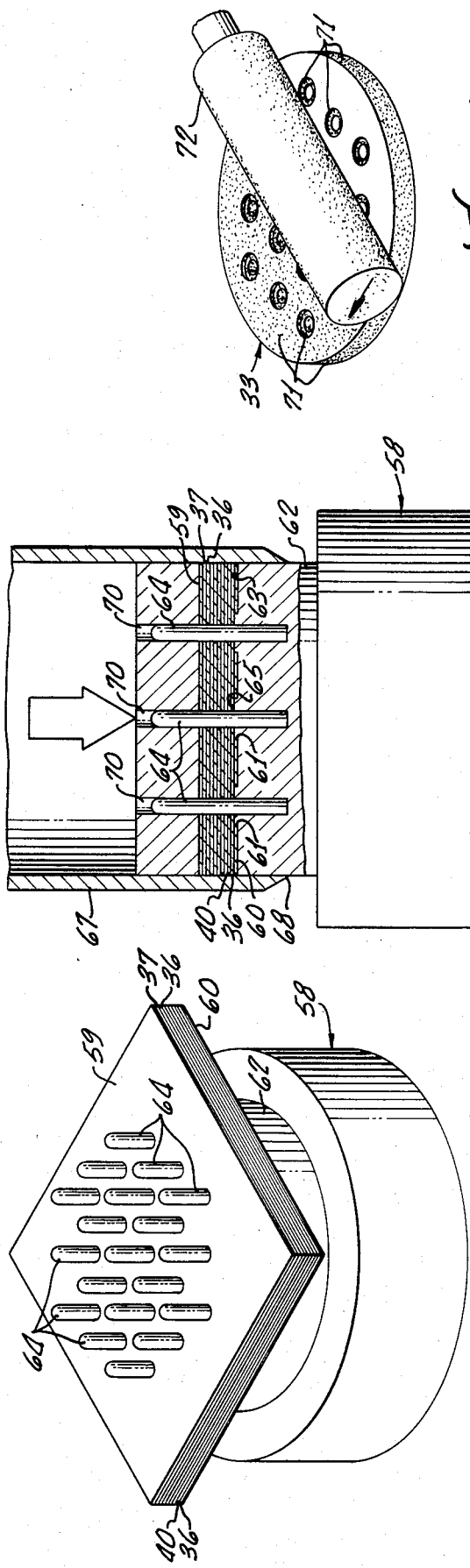

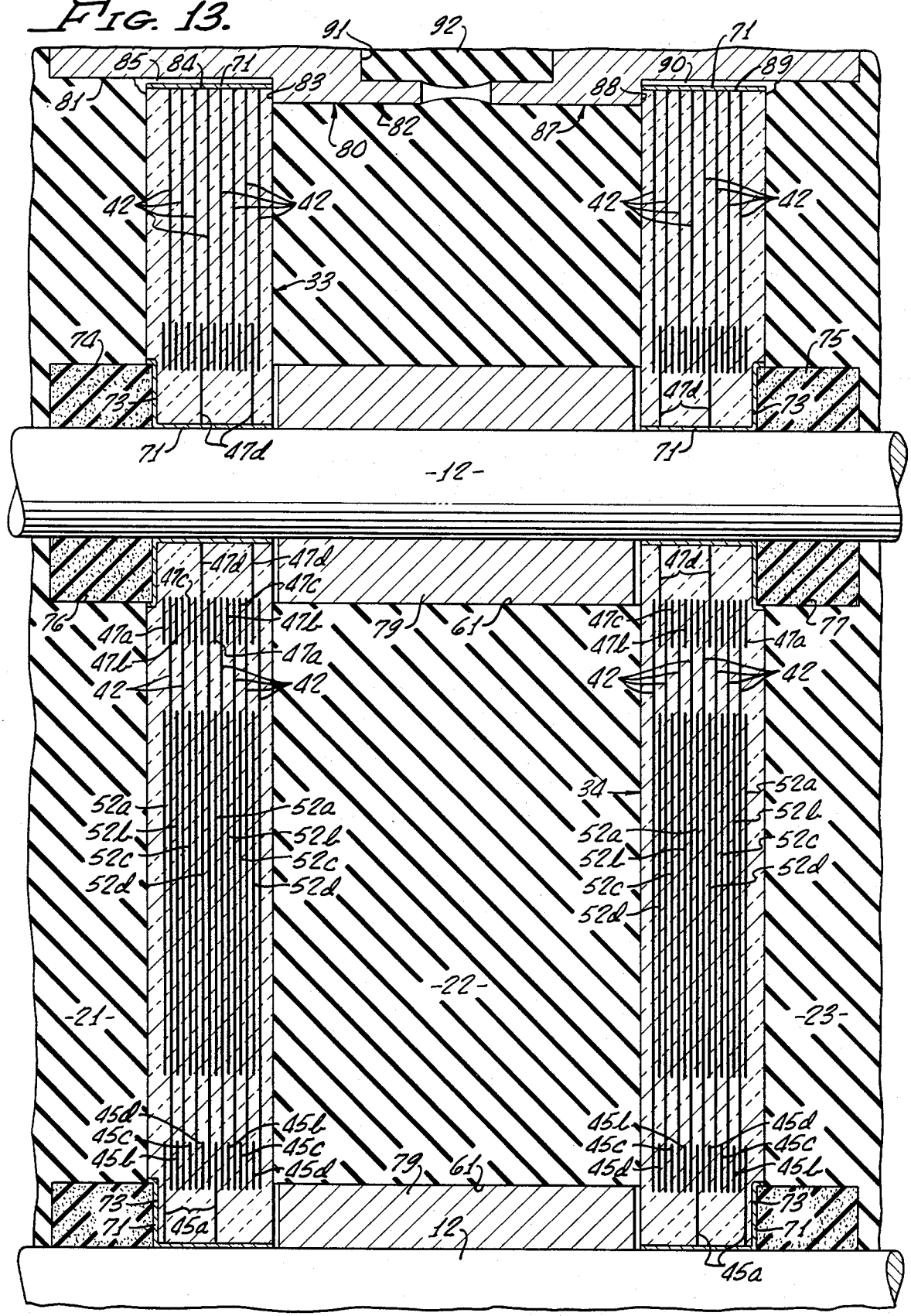

FILTER PIN ELECTRICAL CONNECTOR

BACKGROUND OF THE INVENTION

Filter pin electrical connectors provide a capacitor circuit around the contact pins of the connector for filtering out unwanted signals. This enables the connector to filter out noise without requiring coaxial cables or other elaborate means in association with the interconnecting wires. The conventional filter pin connector includes a tubular ceramic capacitor unit that extends around each of the pins, providing capacitors in conductive plates extending circumferentially within the ceramic tube.

The tubular capacitors of these filter pin connectors have been fragile and easily broken. When one capacitor in the multiple pin connector becomes broken, a major disassembly operation is required to replace the damaged capacitor. Also, the manufacture of the tubular capacitors and connectors using them is expensive. By being tubular, the capacitors are relatively long, and therefore, add significantly to the bulk of the connector.

BRIEF DESCRIPTION OF THE INVENTION

The present invention provides an improved filter pin connector overcoming the problems of the prior art. The connector utilizes disc-type capacitors, each having openings to receive all of the contact pins of the connector. The capacitors are formed by fused bodies of a dielectric material, preferably ceramic, buried within which are alternate spaced layers of conductive ink having overlapping areas that provide opposed capacitor plates. The capacitor plates are in two sets, one of which is grounded to the connector shell. The other set of plates is formed by discrete patterns of conductive ink defining several plates at each layer. These patterns encompass more than one pin so as to maximize their area, but are connected to only one of the pins encompassed. The patterns are aligned axially of the capacitor disc and connected to different contact pins in axially adjacent layers.

The capacitor discs are positioned in a spaced relationsip, with ferrite cores around the pins between the capacitors. There is no fixed connection between the filter and contact, so that the contact is permitted to float.

The capacitors are made by imprinting electrically conductive ink on ceramic tape with punched holes for receiving the connector pins. The tape laminations are trimmed, compressed, heated to drive off the volatiles and then fired to produce the completed discs.

DESCRIPTION OF THE DRAWINGS

FIG. 1 is a perspective view of the receptacle of a filter pin connector embodying the invention;

FIG. 2 is a longitudinal sectional view, taken along line 2—2 of FIG. 1;

FIG. 3 is a transverse sectional view of the connector, taken along line 3—3 of FIG. 2;

FIG. 4 is a plan view of one type of lamina used in forming the grounding planes of the capacitor disc;

FIGS. 5, 6, 7, and 8 are plan views of laminae for forming the active plates of the capacitor disc;

FIG. 9 is an enlarged sectional view of the two laminae forming a grounding plane and an active plate, showing the patterns of conductive ink thereon, exaggerated in thickness for emphasis;

FIG. 10 is a perspective view of the laminae positioned on a fixture for trimming and compression;

FIG. 11 is a sectional view showing the compression of the laminae to provide a unitary disc;

FIG. 12 is an exploded perspective view of laminae making up a compressed disc;

FIG. 13 is an enlarged fragmentary sectional view of the connector, showing one of the contact pins with the associated capacitor discs; and FIG. 14 is a perspective view of the step of removing plated metal from the end surfaces of the capacitor discs.

DETAILED DESCRIPTION OF THE INVENTION

Illustrated in FIGS. 1, 2 and 3 is the receptacle 10 of an electrical connector, adapted to mate with the connector plug when the circuit is complete. The receptacle 10 includes an outer shell 11 within which is a series of inserts which hold spaced parallel pin contacts 12, the axes of which are parallel to the axis of the shell. In the embodiment illustrated, nineteen contacts 12 are mounted in the connector. Each connector pin 12 is of conventional construction, having a cylindrical forward end 13 projecting into the forward open portion 14 of the shell 11. An annular flange 15 separates the forward pin end from an elongated rearward pin section 16. Facing the forward portion 14 of the shell is an elastomeric insert 17 through which the forward contact ends 13 extend, providing an environmental seal when the receptacle 10 is mated to the plug portion of the connector. Rigid plastic inserts 18 and 19 are rearwardly of the insert 17, with the insert 18 being recessed to receive the contact flanges 15 so that these two inserts can position the contacts and retain them axially. Three resilient elastomeric inserts 21, 22 and 23 are rearwardly of the plastic insert 19, followed by rigid plastic inserts 24 and 25. The latter members provide openings 26 that receive socket contacts 27, and inclined retention fingers 28 which hold the socket contacts in position. The ends of the rearward portions 16 of the contacts 12 extend into and make an electrical connection with the socket contacts 27. The barrels 29 of the socket contacts 27 are crimped to wires 30 extending into the rearward end of the receptacle 10 so that the pin contacts 12 are connected to the wires 30. An elastomeric insert 31 at the rearward end of the receptacle 10 provides an environmental seal around the wires 30.

Within the receptacle 10 are two spaced disc capacitor assemblies 33 and 34 which are used in filtering out unwanted signals transmitted along the contact pins 12. The disc capacitors are circular, with their axes being parallel to the axes of the contact pins 12. The capacitor assembly 33 is positioned between the elastomeric inserts 21 and 22 while the capacitor assembly 34 is between the elastomeric inserts 22 and 23.

The two capacitor assemblies 33 and 34 are identical and are constructed as illustrated in FIGS. 4 through 11. Each capacitor assembly is made from several laminations 36, 37, 38, 39 and 40, stacked one upon the other. Each lamination is a thin section of cast greenware ceramic tape upon which is imprinted a pattern of electrically conductive ink, which may be applied to the tape by a silk screening process.

Punched through the lamination 36 are openings 41, corresponding in number and relative positioning to the conductor pins 12. In this arrangement there is an opening 41 at the center of the lamination with the other openings being in circles of six around it. This includes an inner circle A of relatively small diameter, a larger intermediate circle B, and an outside circle C of still greater diameter. Silk-screened on one surface of the lamination 36 is conductive ink 42 which entirely covers a circular area on the lamination except for narrow annular segments 43 around the openings 41. This insulates the pins that extend through the openings 41 in the completed connector from the conductive ink 42, but permits a connection at the periphery of the lamination 36 to the connector shell, as discussed below. When the capacitor is assembled, the laminations 36 act as grounding planes.

The other laminations 37, 38, 39 and 40 form the active plates in the completed capacitor, providing conductive ink that connects to the perimeters of the holes through which the pins extend, but stops short of the edges of the laminations so as to be insulated from the connector shell. The active plates include arrangements of conductive ink on the ceramic tape that result in separate groups encompassing the openings through the laminations.

Punched openings 44 through the lamination 37 correspond in number and position to the openings 41 in the lamination 36. Conductive ink silk-screened on one side of the lamination 37 defines six spaced patterns 45a, 46a, 47a, 48a, 49a, and 50a, which encompass different groups of the openings 44. All of the ink patterns are the same in size and shape with the exception of the pattern 45a. The latter pattern extends around the center opening 44 and one opening 44 in the inner intermediate and outer circles of openings A, B and C. The conductive ink of the pattern 45a extends to the periphery of the center opening 44, but is spaced from the peripheries of the other openings within its borders so as to leave narrow annular bands of exposed ceramic tape around all but the central opening. This enables the pattern 45a to be connected to the central pin of the connector in the completed assembly, while being insulated from the other pins that will then extend through that pattern.

Each of the patterns 46a, 47a, 48a, 49a and 50a encompass one opening of the inner, outer and intermediate circles of openings 44 through the lamination 37. These ink patterns do not reach the peripheries of the opnings through them, therefore being insulated from the edges of these openings.

Lines of conductive ink 52a are spaced from, but extend between the adjacent ones of the patterns 45a, 46a, 47a, 48a, 49a and 50a, and extend to the outer edge of the lamination 37. The lines 52a later serve to ground signals that would tend to jump from one pattern of conductive ink to the other on the lamination 37.

The patterns 45b, 46b, 47b, 48b, 49b and 50b, on lamination 38, correspond in overall size, shape and position to the patterns 45a, 46a, 47a, 48a, 49a and 50a on the lamination 37. However, on the lamination 38 the conductive ink of each pattern extends to the edge of the opening of the inner circle A of the openings 53 through it, and is spaced from the edges of the remainder of the openings 53. Grounding lines 52b of conductive ink extend between adjacent patterns, as do the lines 52a on the lamination 37.

The laminations 39 and 40 are imprinted with conductive ink patterns 45c, 46c, 47c, 48c, 49c and 50c, and 45d, 46d, 47d, 48d, 49d and 50d, respectively. These patterns are of the same size and shape, and correspond in position to the conductive ink patterns on the laminations 37 and 38. The conductive ink patterns on the lamination 39 connect only to the openings of the outer circle C of openings 54, and those on the lamination 40 extend only to the edges of the openings of the intermediate circle B of the openings 55. Lines of conductive ink 52c and 52d are silk-screened on the laminations 39 and 40, corresponding to the lines 52a and 52b on the laminations 37 and 38.

The laminations 36, 37, 38, 39 and 40 are assembled on a fixture 58, as illustrated in FIG. 8, with as many of the laminations 36 as there are of all of the laminations 37, 38, 39 and 40. There are equal numbers of each of the latter laminations, arranged in sequence, and a lamination 36 is positioned between the adjacent ones of the laminations 37, 38, 39 and 40. There may be one set of the laminations 37, 38, 39 and 40, but normally more than one set is included to obtain a desired amount of capacitance. The laminations are aligned as assembled, so that all of the patterns 45a, 45b, 45c and 45d are in sets in alignment axially of the assembly, as are the other comparably numbered patterns. Two additional laminations 59 and 60 are also included in the assembly at its two opposite ends. These laminations, which provide insulation and thickness, are also of ceramic tape, with openings as in the others, but have no conductive ink imprinted on them. The openings 61 in the end lamination 60 are of larger diameter than the openings in the other laminations.

The fixture 58 has a base 62 with a flat upper surface 63. Parallel pins 64 project upwardly from the surface 63 and correspond in number, location and spacing to the openings 41, 44, 53, 54 and 55 in the laminations 36, 38, 39 and 40, respectively. Annular ridges 65 project above the surfaces 63 and circumscribe the pins 62. The ridges 65 enter the openings 61 in the end lamination 60 when the laminations are positioned on the fixture 58, as seen in FIG. 11. A ring 67, with a sharpened lower edge 68, then is brought down over the laminations which trims the laminations to a circular shape. The outside diameter of the base 62 of the fixture 58 corresponds to the inside diameter of the ring 67 so that the ring 67, after trimming the laminations, can receive both the laminations and a portion of the base beneath them.

With the ring 67 circumscribing the trimmed laminations, a flat upper plate 69 is forced downwardly on top of the laminations so as to compress them. The plate 69 has openings 70 through it to receive the pins 64 and its outside diameter is such that it is substantially complementary to the inside diameter of the ring 67. The laminations are warmed at the time they are compressed by the plate 69, preferably being elevated to a temperature of 100° F. The plate 69 is forced toward the upper surface 63 of the base 62 of the fixture 58 so as to cause a compression of around 2,000 psi, which is applied for around three minutes, resulting in a unitary laminated disc. The plastic binder of the ceramic tape and the conductive ink are made slightly tacky by the heat applied to them so that they fuse slightly with adjoining layers so as to make the components of the assembly adhere together. Also, under these conditions, the ceramic of the tape will flow slightly to aid in producing a laminated disc.

After the compression, the laminated disc is removed from the ring 67 and fixture 58, and is placed in an oven and subjected to heat to drive off the volatiles, which include the plastic binder of the ceramic tape. The conductive ink and ceramic material remain. The laminated disc then is fired so that the ceramic becomes vitreous, and the layers are fused together as a unit. Some reduction in diameter is experienced upon the firing. In the completed capacitor discs, the layers of conductive ink, separated by the dielectric medium of the ceramic and transverse relative to the contact pins 12, form the plates of the capacitor.

Metal then is plated over the entire exterior surfaces of the capacitor discs 33 and 34, and subsequently buffed off of the radial end surfaces of the discs, such as by a grinding wheel 72, as seen in FIG. 14. This leaves the plated metal 71 around the circumferential peripheries of the discs, along the surfaces of the openings through the discs and within the recesses 73 formed by the ridges 65 of the fixture 58. The remainder of the outer surface of the capacitor is of dielectric material.

In the assembled connector, rings 74 and 75 of resilient conductive rubber circumscribe the contact pins 12 and their ends are received within recesses 76 and 77 in the elastomeric inserts 21 and 23, respectively, adjacent the end faces of the discs 33 and 34 that are remote from each other. The conductive rubber rings 74 and 75 are pressed into the recesses 73 where they make good electrical contact with the plated metal 71. They also are compressed around and electrically connected to the contact pins 12.

Additional recesses 78 in the elastomeric insert 22, between the capacitors 33 and 34 receive ferrite cores 79. These are cylindrical sleeves that circumscribe the pins 12 and provide the inductance of the filter circuit. There is a small clearance around the ferrite cores 79 so that they are free to float a limited amount relative to the other connector components.

A ring 80 of conductive plated aluminum circumscribes the capacitor disc 33, as well as portions of the inserts 21 and 22. The periphery of the former insert is notched, so as to receive the forward end portion of the ring 80. Interiorly, the ring 80 is cylindrical in shape, with its inner wall 81 at the forward end being slightly larger in diameter than that of the inner wall 82 at the rearward end, so as to define a radial shoulder 83 between these two walls (see FIG. 13). The rearward peripheral edge of the capacitor disc 33 bears against the shoulder 83. The outer circumferential surface 84 of the capacitor disc 33 is connected to the surface 81 of the ring 80 by a conductive epoxy adhesive or solder 85, which electrically connects the peripheries of the conductive ink layers 42 and the grounding planes 52a, 52b, 52c and 52d to the ring 80.

A similar, but oppositely facing, ring 87 circumscribes the capacitor disc 34, as well as portions of the inserts 22 and 23. The capacitor disc 34 bears against the radial shoulder 88 of the ring 87, and the circumferential surface 89 of the disc 34 is secured to the ring 87 by an electrically conductive epoxy adhesive or solder 90.

The adjacent ends of the rings 80 and 87 are notched inwardly from their exterior surfaces so that collectively the rings define an annular groove 91, rectangular in cross section. Within the groove 91 is an annular member 92 of a conductive elastomer which bears against both of the rings 80 and 87, as well as engaging the receptacle shell 11 along its outer peripheral surface.

The rings 80 and 87 include aligned openings which receive three pins 93 that are parallel to the axis of the connector. The outer ends of these pins fit in openings in the plastic inserts 19 and 24. Two of the pins 93 are carried by one of the rings 80 and 87, and the third by the other ring. In this way the pins 93 serve as an aligning means for assuring proper rotational orientation of the parts as they are assembled. They also provide resistance to twisting of the connector components relative to each other as the assembly is made.

Adjacent its forward end portion 14, the interior wall of the receptacle shell 11 is threaded to receive a threaded annular ring 95 at the forward end of which is an elastomeric sealing ring 96. The threaded ring bears against the plastic insert 19, the forward peripheral edge of which is notched out to receive it. The threaded ring 95 presses rearwardly on the insert 19 to retain the assembled inserts within the receptacle shell 11. The axial load from the threaded ring 95 is resisted by internal shoulders 97 and 98 on the shell 11l, which engage shoulders 99 and 100 on the plastic inserts 24 and 25. This places the elastomeric inserts 21, 22 and 23 and the conductive elastomeric ring 92 under compression, also compressing the conductive rings 74 and 75 within the recesses 73 and around the contact pins 12. This assures a good electrical connection at the capacitor discs 33 and 34, and to the shell 11.

The capacitor discs 33 and 34 include several capacitor plates, depending upon the number of laminations used in making the assembly. One set of plates is formed by the conductive ink 42 from the laminations 36 and the other set by the conductive ink patterns from the laminations 37, 38, 39 and 40. These plates are spaced apart by the fused ceramic from the ceramic tape. Also, the ceramic from the end laminations 59 and 60 insulates the ends of the capacitor discs.

The plates formed by the ink 42 stop short of the pins 12 by virtue of the uncoated areas 43 of the laminations 36 so that they are insulated from the pins. However the conductive ink 42 extends to the peripheries of the capacitor discs where it makes electrical connection with the solder 85 for the disc 33 and 90 for the disc 34. This provides a grounding circuit through the rings 80 and 87 and the conductive elastomer 92 to the receptacle shell 11.

The other capacitor plates make electrical connection to the pins 12, because they are made up of the inked areas that extended to the openings in the laminations 37, 38, 39 and 40. At the openings, the identical active capacitor plates are electrically connected to each other by the plated metal 71 and connect to the pins 12 by the conductive rings 76 and 77, as well as through the plated metal. For example, for the central pin 12 of the connector, the active capacitor plates are formed by the ink patterns 45a of the laminations 37 that make up the assembled capacitor. However, axially adjacent capacitor plates are connected to different contact pins. The capacitance for the central pin is produced by the overlap of the plates 42 and the plates formed by the patterns 45a of the laminations 37. Similarly, the capacitor plates for each of the other pins 12 are produced by the ink patterns extending to the openings through which they extend. For example, the capacitor plates for the pin immediately to the right of the central pin, as viewed in FIG. 5, are the conductive ink patterns 48b of the laminations 38 in the capacitor disc. The amount of capacitance, therefore, can be controlled by the number of laminations in the assembly and the number and size of the conductive ink patterns applied to the laminations The ink patterns 46a, 47a, 48a, 49a and 50a of the laminations 37 are not connected to any contact pins, but do provide some fringing effect to improve capacitance. It is also easier to produce the capacitor discs by including these patterns on the laminations 37 in view of the inclusion of comparable patterns on the other laminations.

The lines 52a, 52b, 52c and 52d of conductive ink disposed intermediate the patterns of the active capacitor plates, act as grounding planes in the completed capacitor discs. This isolates the signals at each of the pins 12. A signal which might jump across the dielectric barrier between adjacent patterns will be intercepted by the grounding planes and conducted to the periphery of the capacitor where it is grounded to the receptacle shell 11. It is possible to make all of the alternate laminations of the capacitor disc the same, each having a conductive area connected to each pin extending through it. However, this will not obtain as much capacitance for a given number of laminations as where there are the patterns, as discussed above, particularly for connectors with a substantial number of pins. This is because the connector pins are closely spaced in such connectors, with only limited free areas around the pins for capacitor plates. Therefore, the number of laminations is minimized, with corresponding reduction in the lengths of the capacitor discs, by using the various conductive ink patterns, and this is preferred in most instances.

The numnber of the conductive ink patterns as well as their sizes and shapes, will vary with the number of pins in the connector. The greater the number of pins, the larger the number of conductive ink patterns normally applied to the laminations.

The foregoing detailed description is to be clearly understood as given by way of illustration and example only, the spirit and scope of this invention being limited solely by the appended claims.

I claim:

1. A filter pin electrical connector device comprising at least one electrical contact,
an electrically conductive shell,
insert means holding said contact in said shell, and capacitor means,
   said capacitor means including two disc means in axially spaced relationship with each other and transverse with respect to and having openings receiving said contact,
   each of said disc means including a body of a dielectric material and first and second laminae of electrically conductive material positioned in a spaced relationship with each other in said dielectric material,
      said laminae being transverse with respect to said electrical contact,
      said first laminae extending to a position adjacent said opening and being electrically connected to said contact for receiving an undesired signal therefrom, said second laminae extending to adjacent the periphery of said disc means and being electrically connected to said shell for conducting a signal to said shell,
   a ring of electrically conductive material around each of said discs,
      each of said rings having a shoulder, each of said discs abutting one of said shoulders for thereby positioning said discs relative to said shell,
   means electrically connecting said second laminae to said rings, and means electrically connecting said rings to said shell.

2. A filter pin electrical connector comprising
an electrically conductive shell,
a plurality of contact pins,
insert means holding said contact pins in said shell in spaced parallelism with each other,
a duality of capacitor discs in said shell positioned so that they are spaced apart and their axes are parallel to the axes of said pins,
said discs including openings receiving said pins,
a conductive sleeve around each of said pins intermediate said discs,
   each of said capacitor discs including a dielectric body, and a plurality of thin electrically conductive plates buried in said body,
   said plates being in two sets alternately arranged, the first of said sets including a conductive plate for each of said pins extending to one of said openings and occupying an area around the opening but spaced from the others of said conductive plates and the periphery of said disc, the second of said sets including a conductive plate extending to the periphery of said disc but being spaced from said openings,
   said first and second sets overlapping to provide opposed capacitor plate areas,
a first means electrically connecting said first set of plates to said shell, said first means including
   an electrically conductive material lining each of said openings and extending to an outer face of said discs,
   and a conductive elastomeric ring for each of said pins,
      each of said conductive elastomeric rings engaging said electrically conductive material on said outer face of said disc and circumscribing and engaging one of said pins for electrically connecting said first set of plates to said pins,
and a second means electrically connecting said second set of plates to said shell.

3. A device as recited in claim 2 in which for each of said discs said conductive elastomeric rings are adjacent the face thereof remote from the other of said discs.

4. A device as recited in claim 3 in which said insert means comprises a plurality of resilient elastomeric inserts which include an elastomeric insert intermediate the adjacent faces of said discs, and an elastomeric insert adjacent the face of each of said discs remote from the other of said discs.

5. A device as recited in claim 4 in which each of said elastomeric inserts adjacent said remote faces is recessed for receiving said elastomeric conductive rings, and in which said elastomeric inserts apply compression to said elastomeric electrically conductive rings for causing said elastomeric electrically conductive rings to make good electrical contact with said electrically conductive material and said pins.

6. A filter pin electrical connector comprising
an electrically conductive shell,
a plurality of contact pins,
insert means holding said contact pins in said shell in spaced parallelism with each other,
a duality of capacitor discs in said shell positioned so that they are
spaced apart and their axes are parallel to the axes of said pins, said discs including openings receiving said pins,
a conductive sleeve around each of said pins intermediate said discs,
   each of said capacitor discs including a dielectric body, and a plurality of thin electrically conductive plates buried in said body, said plates being in two sets alternately arranged, the first of said sets including a conductive plate for each of said pins extending to one of said openings and occupying an area around the opening but spaced from the others of said conductive plates and the periphery of said disc, the second of said sets including a conductive plate extending to the periphery of said disc but being spaced from said openings, said first and second sets overlapping to provide opposed capacitor plate areas, a first means electrically connecting said first set of plates to said pins, and a second means electrically connecting said second set of plates to said shell, said second means including an annular electrically conductive member circumscribing said discs, connecting means electrically connecting said second set of plates to said annular member, said annular member defining an annular groove, and a conductive elastomeric member in said groove and bearing against said shell for providing an electrical connection between said annular member and said shell.

7. A device as recited in claim 7 in which said annular electrically conductive member is in two parts each of which is so connected to one of said discs, said two parts being notched on their adjacent faces to define said annular groove.

8. A device as recited in claim 7 in which said connecting means is a conductive epoxy adhesive.

9. A device as recited in claim 8 in which said connecting means is solder.

10. The method of making a filter pin electrical connector comprising the steps of providing a capacitor disc made by imprinting first patterns of electrically conductive material on a plurality of first laminations of ceramic tape which are of a first relatively large lateral dimension, forming a plurality of first openings through said first laminations so that said electrically conductive material of said first patterns extends to said openings, imprinting second patterns of electrically conductive material on a plurality of second laminations of ceramic tape which are of a first relatively large lateral dimension, forming a plurality of second openings in said second laminations so that said electrically conductive material of said second patterns is spaced from said second openings, arranging said first and second laminations alternately with said first and second openings and registry and said first and second patterns in a spaced overlapping relationship with each other, trimming said first and second laminations to a second and smaller lateral dimension in which said first patterns of electrically conductive material are spaced from the peripheries of said first laminations, and said second patterns of electrically conductive material extend to the peripheries of said second laminations, compressing said laminations so arranged, and fusing said compressed laminations so as to provide a unitary disc, with said registered openings of said laminations providing a plurality of openings through said disc, positioning said disc in an electrically conductive connector shell, extending a contact pin through each of said openings of said disc, electrically connecting said contact pins to said electrically conductive material of selected ones of said first laminations, and electrically connecting said shell to said electrically conductive material of said second laminations.

11. The method as recited in claim 10 in which a fixture is prepared having a base and a plurality of pins extending therefrom, said first and second laminations are positioned on said fixture in an alternate relationship with said pins of said fixture extending through said openings in said first and second laminations, and in which said laminations are so trimmed while so positioned on said fixture.

12. The method as recited in claim 11 in which for so trimming said laminations a ring is moved toward said base so as to cut off the outer portions of said laminations and position said ring around said lamination, and while said ring is so positioned, a member is brought to bear against said laminations so as to compress said laminations between said member and said base, for thereby so compressing said laminations.

13. The method as recited in claim 12 in which said laminations are heated to around 100° F. while they are so compressed for causing said laminations to adhere to each other.

14. The method of making a filter pin electrical connector comprising the steps of providing a capacitor disc made by imprinting first patterns of electrically conductive material on a plurality of first laminations of ceramic tape, forming a plurality of first openings through said first laminations so that said electrically conductive material of said first patterns extends to said openings and is remote from the peripheries of said first laminations, imprinting second patterns of electrically conductive material on a plurality of second laminations of ceramic tape, forming a plurality of second openings in said second laminations so that said electrically conductive material of said second patterns is spaced from said second openings and extends to the peripheries of said second laminations, arranging said first and second laminations alternately with said first and second openings and registry and said first and second patterns in a spaced overlapping relationship with each other, compressing said laminations so arranged, and fusing said compressed laminations so as to provide a unitary disc, with said registered openings of said laminations providing a plurality of openings through said disc, plating said unitary disc with metal over its exterior surface including the surfaces of said openings, where said plated metal is connected to selected ones of said first laminations, and the circumferential periphery of said disc where said plated metal is connected to said second laminations, then removing said metal from the end surfaces of said disc so as to leave said metal on said surfaces of said openings and on said circumferential periphery of said disc, positioning said disc in an electrically conductive connector shell, extending a contact pin through each of said openings of said disc, electrically connecting said contact pins to said metal on said surfaces of said openings and hence to said electrically conductive material of selected ones of said first laminations, and electrically connecting said metal on said circumferential periphery to said shell for electrically connecting said shell to said electrically conductive material of said second laminations.

15. The method as recited in claim 14 in which said disc is provided with radial end surfaces, recesses in one of said end surfaces are provided around said openings, said plated metal being removed from said radial end surfaces but not from the surfaces of said recesses, said plated metal on the surfaces of said recesses being connected to said plated metal on the surfaces of said openings, and said plated metal on the surfaces of said recesses then is connected to said contact pins.

16. The method as recited in claim 15 in which for so connecting said plated metal on the surfaces of said recesses to said contact pins a ring of electrically conductive elastomeric material is extended around each of said contact pins and pressed into said recesses so as to engage said plated metal in said recesses.

17. A filter pin electrical connector device comprising
a plurality of electrical contacts,
an electrically conductive shell,
insert means holding said contacts in said shell, and capacitor means,
 said capacitor means including disc means transverse with respect to and having a plurality of openings therethrough receiving said contacts,
 said disc means including a body of a dielectric material and a plurality of first and a plurality of second laminae of electrically conductive material positioned alternately in a spaced relationship with each other in said dielectric material,
  said laminae being transverse with respect to said electrical contacts,
  each of said first laminae including a plurality of discrete elements, each of which receives a plurality of said contacts, said discrete elements being in sets of similar exterior periphery aligned axially of said disc, at least one of said discrete elements of each of said sets being electrically connected to a first of said contacts extending therethrough for receiving an undesired signal therefrom, and being insulated from a second of said contacts extending therethrough, at least a second of said discrete elements of each of said sets being insulated from said first contact and electrically connected to said second contact,
  said second laminae overlapping all of said discrete elements of said first laminae, being spaced from said contacts and extending to adjacent the periphery of said disc means and being electrically connected to said shell for conducting a signal to said shell.

18. A filter pin electrical connector comprising
a plurality of electrical pin contacts,
an electrically conductive shell,
insert means holding said contacts in spaced parallelism in said shell,
and capacitor means including a duality of discs in said shell positioned so that they are spaced apart and parallel,
 each of said discs having a plurality of openings each of which receives one of said contacts,
 and being made of a plurality of first and second laminations of ceramic tape alternately arranged and fused together,
  said first laminations having a plurality of first patterns of electrically conductive ink thereon each of which encompasses a plurality of said openings and extends to one of said openings so encompassed while being spaced from at least one other of said openings so encompassed, said first patterns being spaced from the periphery of said disc,
  said second laminations having second patterns of electrically conductive ink thereon extending from the periphery of said disc to a position of spaced adjacency with said openings, said second patterns overlapping said first patterns for providing opposed capacitor plates,
  said first patterns being in alignment axially of said disc, said first patterns of adjacent first laminations extending to different ones of said openings so encompassed,
 means for electrically connecting said pin contacts to said first patterns at the locations where said first patterns so extend to said openings,
 and means for electrically connecting said second patterns to said shell.

19. The method of making a filter pin electrical connector comprising the steps of
providing a capacitor disc made by
 forming a plurality of first openings through a plurality of first laminations of ceramic tape,
 imprinting a first pattern of electrically conductive material on each of said first laminations of ceramic tape such that each of said first patterns encompasses a plurality of said first openings and extends to one of said first openings so encompassed while being remote from at least one other of said first openings so encompassed, and such that said first patterns are remote from the peripheries of said first laminations,
 imprinting second patterns of electrically conductive material on a plurality of second laminations of ceramic tape,
 forming a plurality of second openings in said second laminations such that said electrically conductive material of said second patterns is spaced from said second openings and extends to the peripheries of said second laminations,
 arranging said first and second laminations alternately with said first and second openings and registry and said first and second patterns in a spaced overlapping relationship with each other with said first patterns in alignment with each other, and said first patterns of adjacent first laminations extending to different ones of said first openings,
 compressing said laminations so arranged, and fusing said compressed laminations so as to provide a unitary disc, with said registered openings of said laminations providing a plurality of openings through said disc,
positioning said unitary disc in an electrically conductive connector shell,
extending a contact pin through each of said openings of said unitary disc,
electrically connecting said contact pins to the said electrically conductive material of said first laminations where said electrically conductive material of said first laminations so extends to said first openings, and electrically connecting said shell to said electrically conductive material of said second laminations.

20. A filter pin electrical connector device comprising a plurality of electrical contacts, an electrically conductive shell, insert means holding said contacts in said shell, and capacitor means, said capacitor means including disc means transverse with respect to said contacts and having a plurality of openings, one of said contacts being received in each of said openings, said disc means including a body of a dielectric material and first and second laminae of electrically conductive material positioned in a spaced relationship with each other in said dielectric material, said first laminae including a plurality of discrete elements of said electrically conductive material, each of which encompasses a plurality of said openings, said laminae being transverse with respect to said electrical contacts, at least one of said elements of said first laminae extending to at least a first of said openings and being electrically connected to a first of said contacts received therein for receiving an undesired signal therefrom, and extending to a position adjacent but spaced from at least a second of said openings and being insulated from a second of said contacts received in said second opening, at least a second of said elements of said first laminae extending to a position adjacent but spaced from at least said first opening and being insulated from said first contact, and extending to at least said second opening and being electrically connected to said second contact, said second laminae extending to adjacent the periphery of said disc means and being electrically connected to said shell for conducting a signal to said shell.

* * * * *

UNITED STATES PATENT AND TRADEMARK OFFICE
CERTIFICATE OF CORRECTION

PATENT NO. : 4,494,092

DATED : January 15, 1985

INVENTOR(S) : ALAN L. GRIFFIN

It is certified that error appears in the above-identified patent and that said Letters Patent is hereby corrected as shown below:

In claim 7 (column 9), line 1, "7" should be -- 6 --.

Signed and Sealed this

Twenty-eighth Day of May 1985

[SEAL]

Attest:

DONALD J. QUIGG

*Attesting Officer*   *Acting Commissioner of Patents and Trademarks*